US010908041B2

(12) United States Patent
Robert et al.

(10) Patent No.: US 10,908,041 B2
(45) Date of Patent: Feb. 2, 2021

(54) DEVICE FOR MEASURING CHARACTERISTICS OF A FLUID

(71) Applicant: COMMISSARIAT A L'ENERGIE ATOMIQUE ET AUX ENERGIES ALTERNATIVES, Paris (FR)

(72) Inventors: Philippe Robert, Grenoble (FR); Jean-Philippe Polizzi, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 394 days.

(21) Appl. No.: 15/771,559

(22) PCT Filed: Oct. 28, 2016

(86) PCT No.: PCT/EP2016/076013
§ 371 (c)(1),
(2) Date: Oct. 18, 2018

(87) PCT Pub. No.: WO2017/072270
PCT Pub. Date: May 4, 2017

(65) Prior Publication Data
US 2019/0041286 A1 Feb. 7, 2019

(30) Foreign Application Priority Data
Oct. 30, 2015 (FR) ..................... 15 60428

(51) Int. Cl.
*G01L 19/00* (2006.01)
*G01L 19/06* (2006.01)
(Continued)

(52) U.S. Cl.
CPC ......... *G01L 19/0069* (2013.01); *G01D 11/30* (2013.01); *G01L 19/143* (2013.01); *G01L 19/147* (2013.01); *H01L 2224/48091* (2013.01)

(58) Field of Classification Search
CPC ......... G01L 7/00; G01L 7/09; G01L 9/00–12; G01L 19/00; G01L 19/0069; G01L 19/06;
(Continued)

(56) References Cited

U.S. PATENT DOCUMENTS 4,703,658 A 11/1987 Mrozack, Jr. et al.
4,939,497 A 7/1990 Nishida et al.
(Continued)

FOREIGN PATENT DOCUMENTS

FR 2786564 A1 6/2000
WO WO 2008/036705 A2 3/2008
WO WO 2010/079004 A1 7/2010

OTHER PUBLICATIONS

International Search Report dated Jan. 27, 2017, in PCT/EP2016/076013, filed Oct. 28, 2016.
(Continued)

*Primary Examiner* — Nguyen Q. Ha
(74) *Attorney, Agent, or Firm* — Oblon, McClelland, Maier & Neustadt, L.L.P.

(57) ABSTRACT

A device for measuring a characteristic of a fluid includes a sensor comprising a first main face furnished with a sensitive part sensitive to said characteristic and intended to be in contact with the fluid, and a second main face opposite furnished with a first electrical contact element on which a measurement signal is obtained. The device also includes a support comprising a first main face provided with a second electrical contact element linked electrically to the first electrical contact element, a second main face opposite, and an opening passing through the main faces of the support. The device further includes a cap fastened to the second main face of the sensor and delimiting, with this second main face, a cavity closed hermetically facing which is disposed the sensitive part of the sensor; in which the second main face of the sensor is fastened hermetically and/or in a (Continued)

leaktight manner to that of the support at the periphery of the opening, a part of the first electrical contact element being opposite and/or in the opening.

14 Claims, 6 Drawing Sheets

(51) Int. Cl.
  *G01L 19/14* (2006.01)
  *G01D 11/30* (2006.01)
(58) Field of Classification Search
  CPC ..... G01L 19/14; G01L 19/143; G01L 19/147; G01L 7/08; G01D 11/30; H01L 2224/48091
  See application file for complete search history.

(56) References Cited

U.S. PATENT DOCUMENTS

| | | | |
|---|---|---|---|
| 6,122,974 A | * | 9/2000 | Sato .................. G01L 19/147 73/715 |
| 6,688,181 B1 | | 2/2004 | Clerc et al. |
| 2004/0079163 A1 | | 4/2004 | Clerc et al. |
| 2009/0108382 A1 | | 4/2009 | Eriksen et al. |
| 2009/0203163 A1 | | 8/2009 | Eriksen et al. |
| 2010/0065934 A1 | | 3/2010 | Eriksen et al. |
| 2010/0073123 A1 | * | 3/2010 | Craddock ........... G01L 19/0069 338/42 |
| 2010/0155866 A1 | | 6/2010 | Guo et al. |
| 2011/0256652 A1 | | 10/2011 | Guo et al. |
| 2018/0003584 A1 | * | 1/2018 | Danel .................. G01L 19/149 |

OTHER PUBLICATIONS

French Search Report dated Jun. 27, 2016, in FR 1560428, filed Oct. 30, 2015.
U.S. Appl. No. 14/134,356, filed Dec. 19, 2013, 2014/0177881 A1, Stephane Fanget et al.
U.S. Appl. No. 15/248,756, filed Aug. 26, 2016, 2017/0059420 A1, Patrice Rey et al.
U.S. Appl. No. 15/454,249, filed Mar. 9, 2017, 2017/0261528 A1, Bruno Fain et al.
U.S. Appl. No. 15/536,779, filed Jun. 16, 2017, 2017/0363493 A1, Bruno Fain et al.
U.S. Appl. No. 15/537,179, filed Jun. 16, 2017, 2018/0003584 A1, Jean-Sebastien Danel, et al.

* cited by examiner

DEVICE FOR MEASURING CHARACTERISTICS OF A FLUID

TECHNICAL FIELD AND PRIOR ART

The invention relates to a device and a method for measuring one or more characteristics of a fluid, for example the pressure, or the force of a flow or parietal force to determine the flow rate, of a liquid or gaseous flow. The invention can in particular be applied to a pressure measurement for a fluid in industrial, motor, medical, aviation or general public applications, etc.

Gas sensors, flow rate sensors or pressure sensors are used in numerous fields of application. Regardless of the field in question, improving reliability and cutting costs are key, sought-after features. These features must be handled with regard to the sensing element, i.e. the sensor that is produced, for example, in the form of a MEMS/NEMS component or an electronic component, however also with regard to the packaging and assembly of said sensor.

In order to guarantee maximum reliability, in particular for environments under harsh restrictions (corrosive fluids or gases, capacity of the sensor to withstand high pressures and/or high temperatures), the packaging and assembly of the sensor must be able to provide:
- an assembly configuration that protects the connectors from the environment in which the measurement is taken (to prevent risks of corrosion, short-circuits, etc.);
- an assembly of the sensor with the housing that is able to withstand high pressures (for example greater than 10 bar) and/or impacts under pressure, without the risk of the sensor coming away from the assembly;
- where possible, a packaging configuration that limits the mechanical stresses applied to the sensor as a result of the assembly with the housing and the thermal stresses applied on the sensor and linked to the placement thereof;
- a low-cost approach (simple placement and assembly, comprising a reduced number of elements).

A plurality of solutions exists for protecting the connectors from the environment in which the measurement is taken, and in order to overcome the problems of ensuring the sensor is capable of withstanding high pressures and temperatures.

A first solution consists of using a protective gel dispensed inside the housing in which the sensor is encapsulated and which covers the sensor membrane (which forms the part of the sensor that is sensitive to the characteristic measured) and the connectors (contact studs, connecting wires). The housing comprises an orifice opening out onto the protective gel so that the membrane can be subjected to the measured characteristic via the protective gel.

However, said first solution is not suitable for corrosive environments or for measuring the characteristics of liquids, since the protective gel is permeable for humidity and can deteriorate on contact with an aggressive environment. Moreover, adhesion and/or aging problems concerning the protective gel also occur. Furthermore, said first solution can only be used for pressure sensors and not for other types of sensor (flow rate sensor).

A second solution consists of encapsulating the sensor within a cavity filled with a non-deformable fluid, generally a silicon oil. In such a case, the sensor is placed in a housing filled with said oil. The housing is then hermetically sealed by a cover provided with a flexible metal membrane so that the fluid characterised and the oil encapsulating the sensor are under the same pressure. The pressure is thus transmitted to the sensor via the oil.

However, such a packaging according to this second solution is expensive as a result of its production complexity. This solution is complex to implement as it requires the creation of a hermetically-sealed closure of the housing without creating an initial pressure in the oil and without trapping any air bubbles, which would hinder the correct transmission of the pressure to the sensor. Moreover, this type of packaging is a source of thermal drifts resulting from the use of the oil and is subjected to the ageing of the oil used. Finally, this second solution can only be used for a pressure sensor. A third solution consists of mounting the sensor via a backside sense silicon packages. According to this configuration, the backside of the sensor, which comprises the sensing part that is sensitive to the characteristic intended to be measured, is attached to an inner wall of a protective housing, for example via a sealed seam. An orifice passes through the housing and opens out onto said sensing part of the sensor so that it is exposed to the fluid to be characterised. Electrical contact elements of the sensor are arranged on the topside of the sensor, which is exposed to the inner volume of the protective housing. The electrical contact elements and the connectors are isolated from the fluid by the sealed seam connecting the sensor to the housing. The fluid is thus only in contact with the sensing part of the sensor which is, for example, made of silicon.

This solution limits the temperature drifts and cost of the packaging compared to those of the second aforementioned solution, and provides more effective protection from corrosive fluids than the first solution that implements the protective gel.

However, this third solution poses problems with regard to its capability to withstand high pressures (typically greater than about 10 bar), given the sensor placement method (backside) on the housing, which makes it likely to come away in the event of excess pressure.

Document WO 2010/079004 discloses another solution, wherein the sensor is assembled on a topside of a substrate by flip-chip method in order to electrically and mechanically connect the sensor to the substrate. As a result of obtaining the electrical and mechanical connections between the sensor and the substrate simultaneously by implementing the same step, the possible configurations thereof are limited and it is more difficult to produce from a technological angle. Moreover, the electrical connection of the sensor is made on the topside of the substrate which is in contact with the fluid.

DESCRIPTION OF THE INVENTION

One purpose of this invention is to propose a measuring device that overcomes the aforementioned problems for the sensor assembly and packaging solutions of the prior art, i.e. for:
- effectively protecting the electrical connections of the measuring device from the fluid to be characterised;
- producing a hardy sensor/housing assembly;
- limiting the mechanical and thermal stresses applied to the sensor;
- allowing the production thereof at a low cost.

For this purpose, the invention proposes a device for measuring at least one characteristic of a fluid, comprising at least:
- a sensor comprising a first main face provided with at least one sensing part that is sensitive to said characteristic and intended to be in contact with the fluid, and a second main face opposite the first main face and provided with at least one first electrical contact element on which at least one measurement signal from the sensor can be obtained;

a support comprising a first main face provided with at least one second electrical contact element electrically connected to the first electrical contact element, a second main face opposite the first main face of the support, and at least one opening passing through the first and second main faces of the support;

wherein the second main face of the sensor is attached in a watertight and/or hermetically-sealed manner to the second main face of the support at least at the periphery of the opening, and such that at least one part of the first electrical contact element is arranged facing and/or inside the opening.

In such a measuring device, the electrical contact elements of the sensor and of the support are arranged on the same side of the device, opposite the side intended to be in contact with the fluid to be characterised. Said electrical contact elements are well protected from the fluid to be characterised as a result of the hermetically-sealed and/or watertight attachment between the sensor and the support, thus hermetically and/or imperviously isolating the two opposite sides of the device. Such a measuring device can thus be used to characterise an aggressive, corrosive or electrically-conducting fluid.

Moreover, in such a measuring device, the sensor is assembled in a hardy manner to the support, without the sensor having to undergo tensile stresses that could cause it to come away from the support.

The support may advantageously be of the ceramic or glass type, which minimises the stresses caused by a difference in the coefficient of thermal expansion between the sensor and the support. However, the support may correspond to other types of housing such as: TO, plastic or CSP ("Chip Scale Package"), etc.

Such a measuring device also has the advantage of the ability thereof to be produced at a low cost.

In the device according to the invention, the support may be planar, i.e. may correspond to a layer or a wafer.

In the measuring device, the electrical connections and the mechanical connections may be made non-simultaneously, whereby the electrical and mechanical connections between the sensor and the support are not produced on the same face of the support.

The sensor may correspond to a pressure sensor (sensing absolute or differential pressure), or a flow rate sensor for a liquid or gaseous fluid. The sensor may also correspond to a microphone or to any sensor whatsoever, for example a sensor of the type MEMS/NEMS (Micro-Electro-Mechanical System/Nano-Electro-Mechanical System).

The attachment produced between the second main face of the sensor and the second main face of the support may be watertight when the fluid corresponds to a liquid. When the fluid is gaseous, said attachment may be hermetically-sealed.

The second main face of the support may be intended to be in contact with the fluid.

The sensing part of the sensor may comprise at least one membrane, whereby the sensor may be a piezoresistive, capacitive, piezoelectric or heat sensor.

The second main face of the sensor may be attached to the second main face of the support by at least one hermetic and/or watertight sealed seam or by direct bonding.

The device comprises at least one cap attached to the second main face of the sensor and delimiting, with the second main face of the sensor, at least one cavity that is hermetically closed and facing which is arranged at least the sensing part of the sensor. Such a configuration in particular allows a void to be formed in the cavity. Thus, the sensing part of the sensor is not subjected to a pressure originating from the side of the second main face of the sensor, and can thus measure the absolute value of the pressure on the side of the first main face of the sensor, and thus the absolute value of the fluid pressure.

The second main face of the support may be attached in a hermetically-sealed and/or watertight manner to the cap, which is hermetically attached to the second main face of the sensor. Thus, the hermetically-sealed and/or watertight mechanical connection between the second main face of the support and the second main face of the sensor is produced by way of the cap.

The second electrical contact element may be electrically connected to the first electrical contact element by at least one electrical connection passing through the cap. Such an electrical connection may correspond, for example, to a conductive via formed in the cap or to any electrical connection passing through an opening formed in the cap.

The sensing part of the sensor can be laterally offset relative to the opening in the support, i.e. it can be positioned not facing the opening. This configuration produces a better mechanical and thermal decoupling of the sensor relative to the region at which the sensor is attached to the support and located at the periphery of the opening in the support. Moreover, in this configuration, the sensing part of the sensor is not required to be surrounded by a region of the sensor attached to the support. Thus, the mechanical stresses generated by the watertight/hermetically-sealed assembly between the second main face of the support and the second main face of the sensor, at the region at which the sensor is attached to the support, do not affect the sensing part of the sensor, and thus the operation of the sensor, in particular in the case of a pressure sensor, the measuring principle whereof is intrinsically sensitive to mechanical stresses. The region of the sensor attached to the support corresponds, in such a case, to the parts of the sensor in direct or indirect contact with the support or with the sealed seam. In other words, a projection of the surface of the sensing part in a plane parallel to the second main face of the sensor does not superimpose a projection, in said same plane, of the region at which the sensor is attached to the support.

In another configuration, the sensing part of the sensor may be arranged facing the opening. In such a case, the cap may be partially arranged inside the opening in the support.

The device may further comprise at least one protective material covering at least one part of the second main face of the sensor and at least one part of the second electrical contact element. An additional protection can thus be provided protecting the elements covered by said protective material, for example a protective gel or cover.

The device may further comprise a supporting element arranged between the second electrical contact element and the first main face of the support. This configuration is advantageous when the support is made of a material that is not compatible with the production of electrical contact elements thereon.

In one specific configuration, the device may be such that:
the support forms a part of at least one housing surrounding the sensor by forming at least one first volume in which the sensing part of the sensor is arranged and a second volume in which the first electrical contact element and one part of the second electrical contact element are arranged, the support and the sensor form a hermetically-sealed and/or watertight separation between the first and second volumes, the housing is provided with at least one orifice opening out into the first volume, the second electrical contact element passes through the housing and comprises an end arranged outside of the housing.

This configuration in particular provides additional protection for the sensor.

In another configuration, the device may further comprise at least one protective cover attached to the first main face of the support and forming, with the support and the sensor, at least one volume in which the first electrical contact element and a part of the second electrical contact element are located, whereby the second electrical contact element passes through the support and comprises an end arranged outside the volume.

The volume formed by the protective cover may be closed in a hermetically-sealed and/or watertight manner, or the protective cover may be penetrated by at least one orifice opening out into the volume.

Such a protective cover provides additional protection for the sensor and the electrical contact elements of the device. Moreover, if the volume is hermetically sealed, a void can be formed inside said volume. Thus, the sensing part of the sensor is not subjected to a pressure originating from the side of the second main face of the sensor, and can thus measure the absolute value of the pressure on the side of the first main face of the sensor, and thus the absolute value of the fluid pressure. If the protective cover is penetrated by at least one orifice opening out into the volume, the device can perform a relative or differential pressure measurement between the pressure applied by the fluid on the sensing part of the sensor and the pressure to which is subjected the sensor on the side of the first main face of the sensor.

The second electrical contact element may be electrically connected to the first electrical contact element by way of an electrical and/or electronic element arranged on the first main face of the support.

The invention further relates to a measuring assembly comprising at least one measuring device as disclosed hereinabove and a duct, or pipe, in which the fluid can circulate, wherein the second main face of the support of the measuring device is attached in a hermetically-sealed and/or watertight manner to one end or to one wall of the duct such that the sensing part of the sensor is exposed to the interior of the duct by way of the end or by way of an opening formed in the wall of the duct.

The invention further relates to a method for producing a device for measuring at least one characteristic of a fluid, comprising at least the steps of:

producing at least one sensor comprising a first main face provided with at least one sensing part that is sensitive to said characteristic and intended to be in contact with the fluid, and a second main face opposite the first main face and provided with at least one first electrical contact element on which at least one measurement signal from the sensor can be obtained;

producing at least one support comprising a first main face provided with at least one second electrical contact element, a second main face opposite the first main face of the support, and at least one opening passing through the first and second main faces of the support;

attaching in a hermetically-sealed and/or watertight manner the second main face of the sensor to the second main face of the support at least at the periphery of the opening, and such that at least one part of the first electrical contact element is arranged facing and/or inside the opening;

producing an electrical connection connecting the second electrical contact element to the first electrical contact element.

The method further comprises, between the step of producing the support and the step of attaching the sensor to the support, a step of attaching a cap to the second main face of the sensor and delimiting, with the second main face of the sensor, at least one cavity that is hermetically closed and facing which is arranged at least the sensing part of the sensor.

BRIEF DESCRIPTION OF THE FIGURES

This invention will be better understood after reading the following description of example embodiments, given for purposes of illustration only and not intended to limit the scope of the invention, and with reference to the accompanying figures, wherein.

Identical, similar or equivalent parts of the different figures described hereinbelow bear the same reference numerals in order to ease the passage from one figure to another.

The different parts shown in the figures are not necessarily displayed according to a uniform scale in order to make the figures easier to read.

The different possibilities (alternatives and embodiments) must be understood as not being exclusive with regard to each other and can be combined with each other.

DETAILED DESCRIPTION OF THE SPECIFIC EMBODIMENTS

Figure 1:
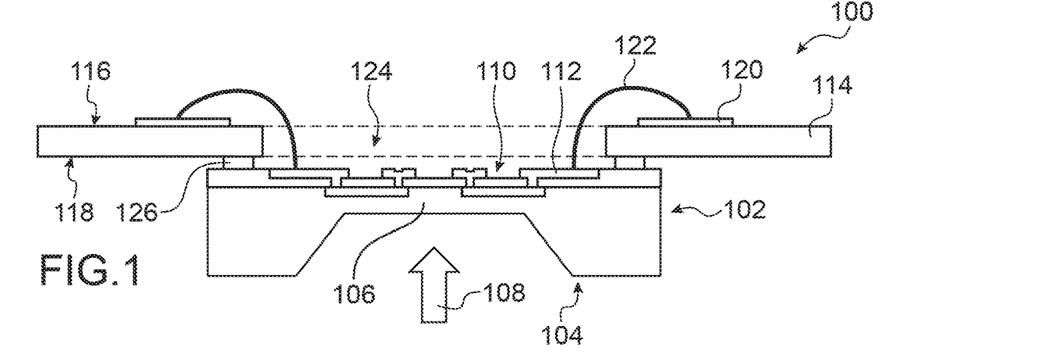
FIGS. 1 and 2 show a measuring device respectively according to a first and second embodiment.

Reference is firstly made to FIG. 1, which shows a measuring device 100 according to a first embodiment. In this first embodiment, the device 100 corresponds to a measuring device for measuring the pressure or pressure variation of a fluid.

The device 100 comprises a sensor 102 which, in this case, corresponds to a MEMS-type pressure sensor. The sensor 102 comprises a first main face 104 provided with a sensing part 106 that is sensitive to the one or more characteristics of the fluid to be measured, i.e. in this case a sensing part sensitive to the pressure exerted by the fluid. In FIG. 1, the pressure exerted by the fluid on the sensor 102 is symbolised by the arrow bearing the reference numeral 108. In this case, said part 106 is formed by a thinned region of the substrate of the sensor 102, said region forming a membrane acting as a pressure-sensitive electromechanical transducer since said membrane comprises a piezoresistive material.

The sensor 102 further comprises a second main face 110, opposite the first main face 104, on which is produced at least one first electrical contact element 112 corresponding to a contact stud on which the pressure measurement signal transmitted by the sensor 102 is obtained. In FIG. 1, the sensor 102 comprises a plurality of electrical contact elements 112 arranged on the second main face 110.

The first main face 104 of the sensor 102 is intended to be in contact with the fluid, the pressure whereof is being measured, and the second main face 110 of the sensor 102 is intended to be isolated in a hermetically-sealed and/or watertight manner from the fluid. When the second main face 110 of the sensor 102 is subjected to an ambient pressure present on the side of said face, the device 100 thus forms a differential pressure measuring device measuring the difference between the pressure to which the first main face 104 is subjected (pressure of the fluid) and that present on the side of the second main face 110. If a void is formed on the side of the second main face 110, the device 100 thus forms an absolute pressure measuring device measuring the absolute value of the pressure exerted by the fluid on the sensor 102.

The device 100 further comprises a support 114 comprising a first main face 116 and a second main face 118 opposite the first main face 116. In this case, the support 114 is planar and is, for example, formed by a ceramic or glass wafer on which conductive tracks are deposited, for example by screen printing. Alternatively, the support 114 may correspond to a PCB (Printed Circuit Board)-type wafer. Second electrical contact elements 120 (the support 114 comprises at least one second electrical contact element 120) are arranged on the first main face 116 of the support 114 and are electrically connected to the first electrical contact elements 112 by electric wires 122 or by any other suitable electrical connection means. The support 114 further comprises an opening 124 passing through the entire thickness of the support 114, i.e. formed through the first and second main faces 116, 118 of the support 114.

The second main face 110 of the sensor 102 is attached in a hermetically-sealed and/or watertight manner to the second main face 118 of the support 114. In the embodiment shown in FIG. 1, this hermetically-sealed and/or watertight attachment is obtained by a sealed seam 126 formed at the periphery of the opening 124 of the support 114 and around the first electrical contact elements 112. The sealed seam 126 may correspond to a seam made of a metal, a polymer (in the case of a watertight attachment but not for a hermetically-sealed attachment), or a fusible glass material, etc. The first electrical contact elements 112 and the sensing part 106 are arranged facing the opening 124. The electric wires 122 pass through the support 114 at this opening 124.

Given the hermetically-sealed and/or watertight attachment formed by the sealed seam 126 between the sensor 102 and the support 114, the second main face 118 of the support 114 can be in contact with the fluid, but not the first main face 116 of the support 114. Thus, all connectors of the measuring device 100, i.e. the first and second electrical contact elements 112, 120 are protected in a hermetically-sealed and/or watertight manner from the fluid thanks to the hermetically-sealed and/or watertight attachment between the two main faces 110, 118 forming a hermetically-sealed and/or watertight barrier relative to the fluid.

Figures 2, 3:
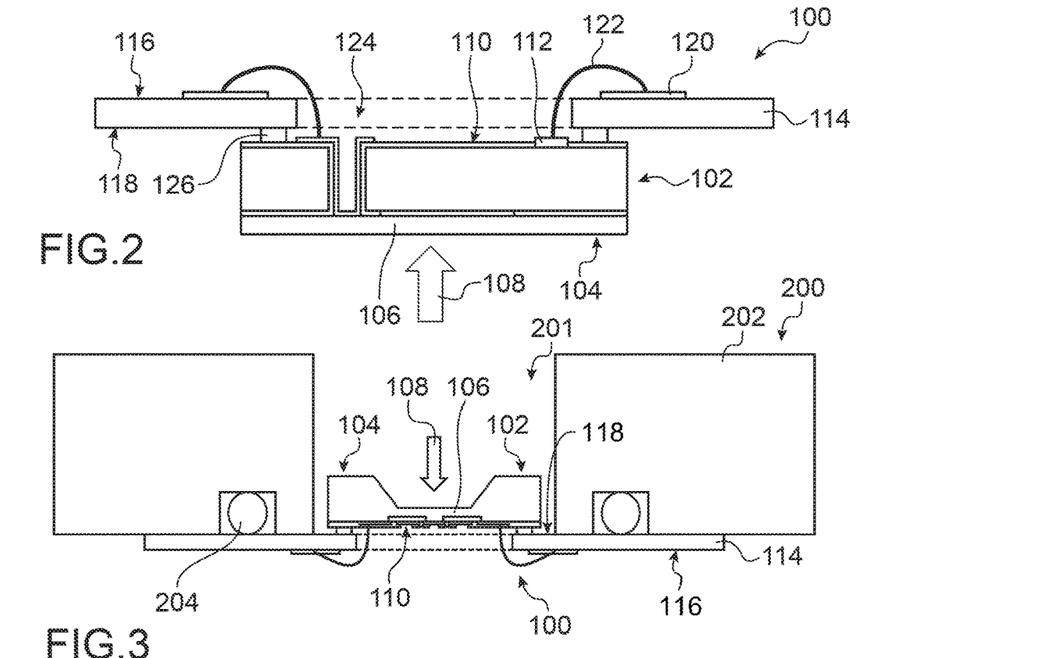
FIG. 3 shows a measuring assembly according to one specific embodiment.

FIG. 2 shows the measuring device 100 according to a second embodiment.

Unlike with the first aforementioned embodiment, wherein the sensor 102 is a pressure sensor with a piezoresistive membrane, the sensor 102 of the device 100 according to the second embodiment corresponds to a capacitive pressure sensor wherein the movements of the membrane corresponding to the sensing part 106 of the sensor 102 are electrically transformed via a change in the electric capacitance value of the sensing part 106. The other elements of the device 100 according to said second embodiment are similar to those of the aforementioned device 100 described with reference to FIG. 1.

FIG. 3 shows one example of mounting a measuring device 100, in this case similar to the aforementioned device 100 described with reference to FIG. 1, in a duct, or pipe, 202, for example corresponding to a metal or plastic pipe, in which circulates the fluid, the pressure whereof is intended to be measured, which form a measuring assembly 200. The device 100 is attached in a hermetically-sealed and/or watertight manner to one end of the duct 202, or to one wall of the duct 202 at the level of an opening 201 formed in said wall, such that the sensing part 106 of the sensor 102 is exposed to the interior of the duct 202. Said attachment is produced between the wall of the duct 202 and the second main face 118 of the support. The sealing of said connection is provided in this example by an O-ring seal 204 arranged on the wall of the duct 202 to which the device 100 is attached, for example, by mechanical clamping. Thus, the fluid circulating in the duct 202 exerts a pressure on the sensing part 106 of the sensor 102 and the electrical contact elements 112 and 120 of the sensor 102 and of the support 114 are not exposed to said fluid.

Figure 4:
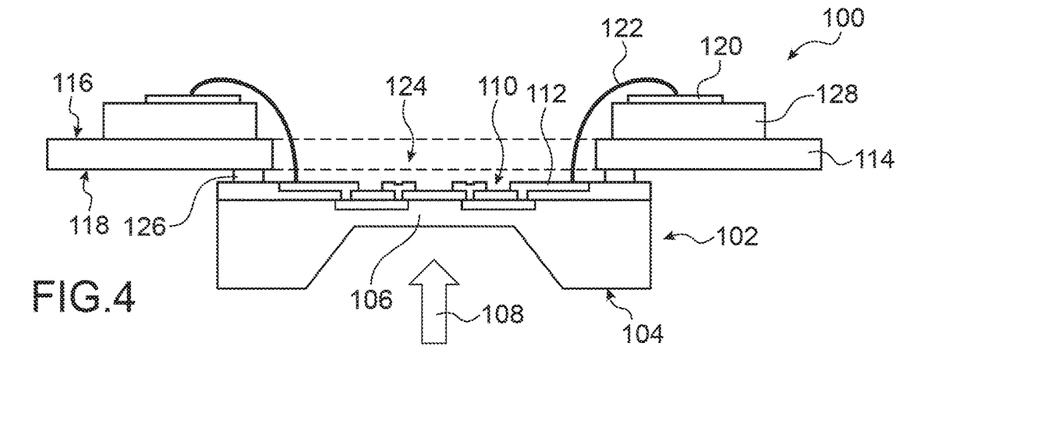
FIGS. 4 to 14 show a measuring device, as disclosed by this invention, according to different embodiments.

FIG. 4 shows a measuring device 100 according to a third embodiment.

By comparison with the first embodiment, the second electrical contact elements 120 are not arranged directly on the first main face 116 of the support 114, but are arranged on a supporting element 128, itself arranged on the first main face 116 of the support 114. Without the presence of the supporting element 128 (as for the first and second aforementioned embodiments), the material of the support 114 must simultaneously be compatible with the fluid, the characteristic whereof is being measured, be capable of forming a watertight and/or hermetically-sealed barrier relative to said fluid, and allow the second electrical contact elements 120 to be produced on the first main face 116 thereof. In said third embodiment, the compatibility with the fluid, the characteristic whereof is being measured and the capacity to form a watertight and/or hermetically-sealed barrier relative to said fluid are dissociated from the compatibility with the production of the second electrical contact elements 120, since only the material of the supporting element 128 must be capable of allowing the second electrical contact elements 120 to be produced thereon. The supporting element 128 corresponds, for example, to a printed circuit board.

The production of such a supporting element 128 is compatible with the aforementioned embodiments.

Figure 5:
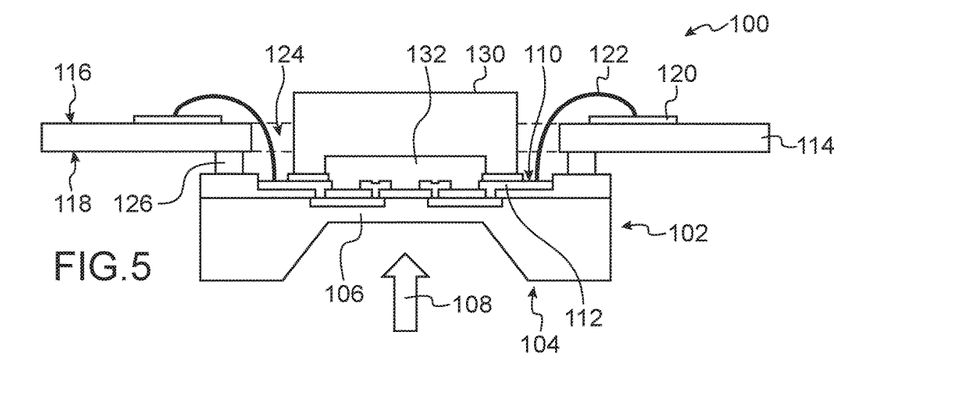

FIG. 5 shows a measuring device 100 according to a fourth embodiment.

By comparison with the first embodiment, the device 100 further comprises a cap 130 attached to the second main face 110 of the sensor 102 and delimiting, with said second main face 110, a cavity 132 that is closed in a hermetically-sealed manner, for example under a vacuum, at the part of the second main face 110 that is located facing the sensing part 106. In addition to the mechanical protection provided by the presence of said cap 130, the vacuum cavity 132 allows the device 100 to perform a measurement of the absolute value of the pressure of the fluid 108, since the part of the second main face 110 located facing the sensing element 106 is not subjected to the ambient pressure present on the side of the second main face 110. In order to form said vacuum cavity 132, the cap 130 is sealed under a vacuum to the second main face 110. Moreover, the first electrical contact elements 112 are removed from the cavity 132 by forming hermetically-sealed bushings from the interior of the cavity 132 to the outside of said cavity 132 such that said contacts can be accessed from the outside of the cavity 132 and can be electrically connected to the second electrical contact elements 120.

The production of the cap 130 and the cavity 132 is compatible with the aforementioned different embodiments.

Figure 6:
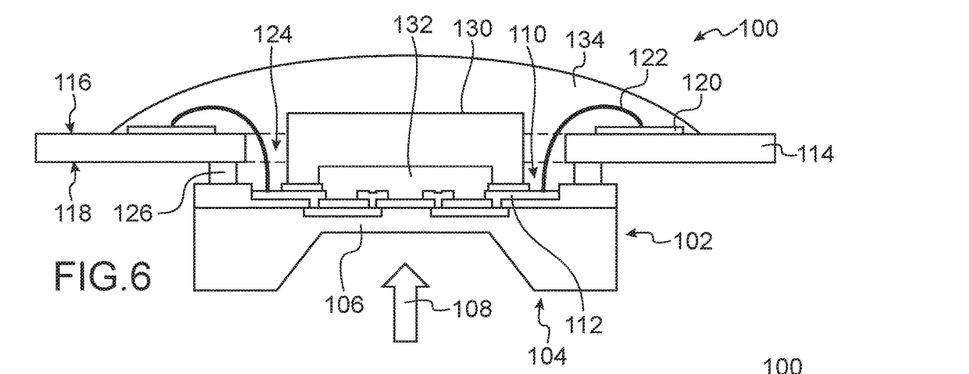

FIG. 6 shows a measuring device 100 according to a fifth embodiment.

By comparison with the aforementioned fourth embodiment described with reference to FIG. 5, the device 100 comprises a protective material 134, which corresponds to a protective gel in the example in FIG. 6, however which could be, for example, produced in the form of a protective cover or in another form, in this case covering the second main face 110 of the sensor 102 in addition to the second electrical contact elements 120 and the wires 122. All of the electrical connection elements of the device 100 are, in this case, protected by the protective material 134. In the absence of the cap 130 (when the device 100 is intended to perform a differential pressure measurement), this protective material 134 further protects the part of the second main face 110 of the sensor 102 that is, in this case, protected by the cap 130.

The production of the protective material 134 is compatible with the aforementioned embodiments.

Figure 7:
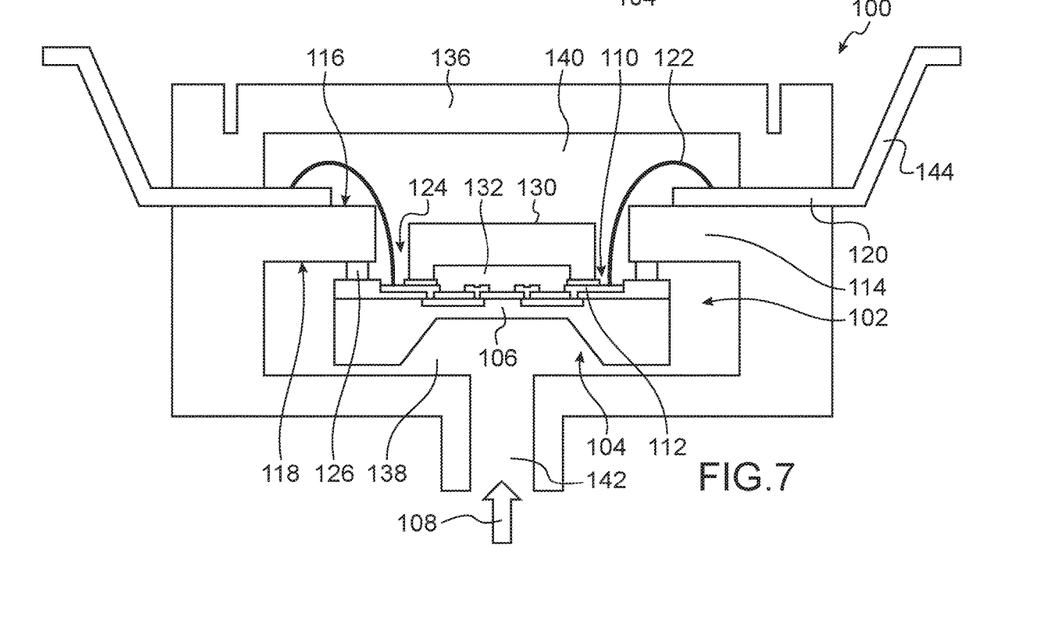

FIG. 7 shows a measuring device 100 according to a sixth embodiment.

In this sixth embodiment, the support 114 forms a part of a housing 136 surrounding the sensor 102. Said housing 136 forms a first volume 138 in which the sensing part 106 of the sensor 102 is arranged, and a second volume 140 in which the first electrical contact elements 112 and a part of the second electrical contact elements 120 are arranged. The first and the second volumes 138, 140 are isolated in a hermetically-sealed manner from one another thanks to the hermetically-sealed attachment produced between the sensor 102 and the support 114. The housing 136 further comprises an orifice 142 opening out into the first volume 138 and allowing the fluid to enter said first volume 138 and come into contact with the sensing part 106 of the sensor 102. Finally, the two electrical contact elements 120 extend over the support 114 such that they pass through the housing 136 and such that ends 144 of said second electrical contact elements 120 open out outside of the housing 136.

Said housing 136 protects the sensor 102 in addition to the connectors of the device 100. Moreover, depending on the pressure present in the second volume 140, said device 100 can perform an absolute pressure or a differential pressure measurement, even in the absence of the cap 130.

Such a housing 136 can also be produced for the aforementioned different embodiments.

Figure 8:
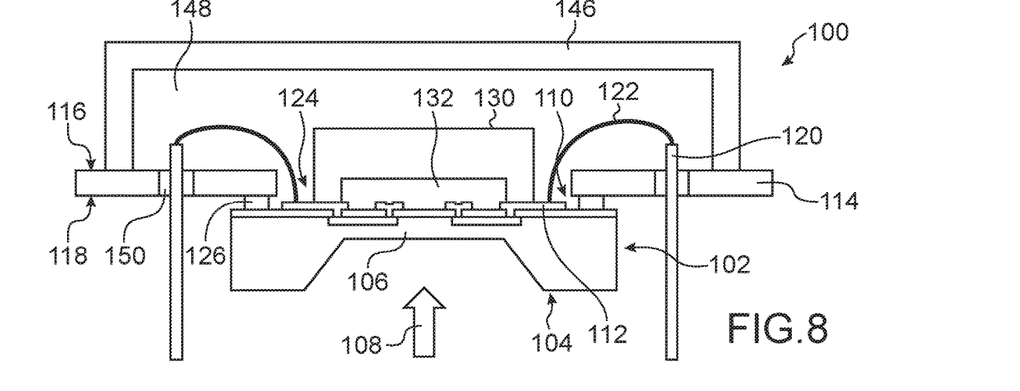

FIG. 8 shows a measuring device 100 according to a seventh embodiment.

In this embodiment, the device 100 comprises a protective cover 146 attached to the first main face 116 of the support 114 and forming, with the support 114 and the sensor 102, a volume 148 in which the first electrical contact elements 110 and a part of the second electrical contact elements 120 are located. The cover 146 protects the electronic part of the device 100. The second electrical contact elements 120 pass through the support 114 (through the main faces 116, 118 of the support 114) such that said electrical contact elements 120 can be accessed from outside the volume 148. A watertight and/or hermetic material 150 present around the parts of the second electrical contact elements 120 passing through the support 114 ensure the watertight and/or hermetic sealing between the second main face 118 of the support 118 and the interior of the volume 148. When the device 100 is intended to perform an absolute pressure measurement for the fluid, the volume 148 can be hermetically closed. In such a case, the cap 130 can be removed.

The production of such a protective cover 146 is compatible with the aforementioned embodiments.

Figure 9:
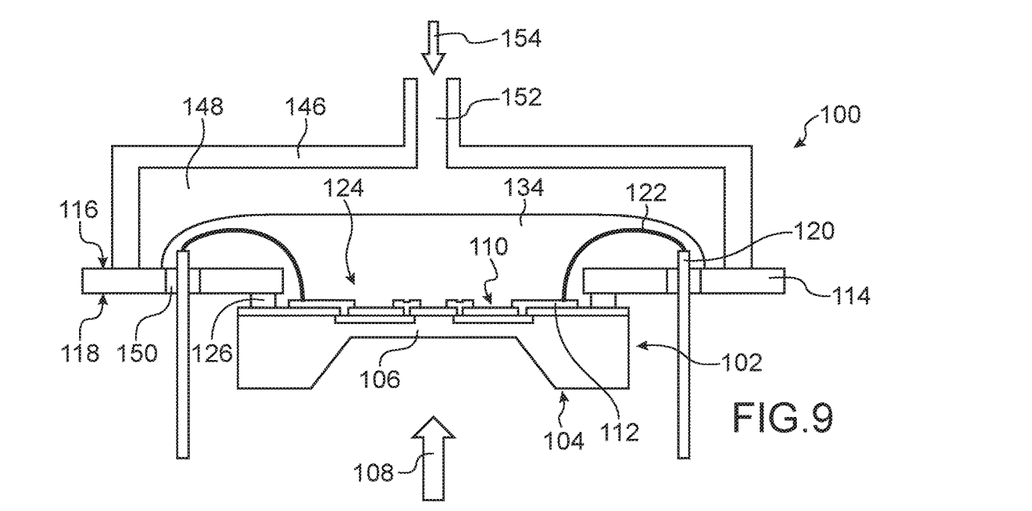

FIG. 9 shows a measuring device 100 according to an eighth embodiment.

As with the seventh aforementioned embodiment, the protective cover 146 is attached to the first main face 116 of the support 114. However, the cover 146 is, in this case, penetrated by an orifice 152, thus bringing the interior of the volume 148 into communication with the ambient atmosphere on the side of the first main face 116 of the support 114, and in particular with the pressure of said atmosphere, symbolised by the arrow bearing the reference numeral 154 in FIG. 9. Thus, the device 100 performs a differential pressure measurement between the pressure 108 of the fluid and the pressure 154 to which the second main face 110 of the sensor 102 is subjected. In this embodiment, the second main face 110 of the sensor 102 is protected by the protective material 134, in this case a protective gel. A differential pressure measurement is performed as said protective gel 134 transmits the pressure 154 onto the second main face of the sensor 102.

Again, the production of such a protective cover 146 is compatible with the aforementioned embodiments.

Figure 10:
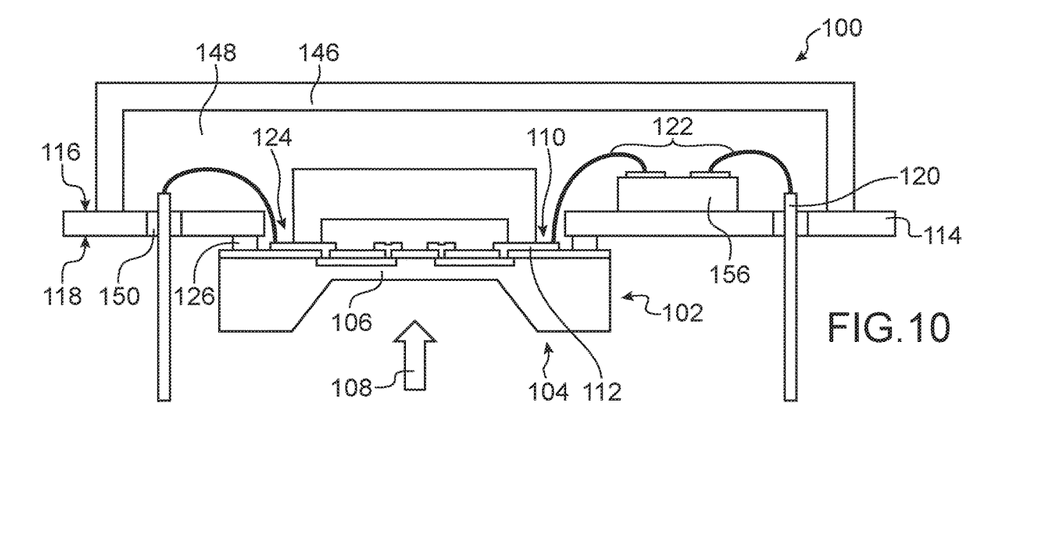

FIG. 10 shows a measuring device 100 according to a ninth embodiment.

Said measuring device 100 comprises all of the elements as previously described with reference to FIG. 8. In said ninth embodiment, the electrical connection between one of the first electrical contact elements 112 and one of the second electrical contact elements 120 is not made directly by a wire 122, but instead by way of an electric and/or electronic circuit 156, for example an ASIC (Application-Specific Integrated Circuit), a printed circuit board, or more generally any intermediate electrical and/or electronic element. In FIG. 10, said element 156 is arranged in the volume 148, on the first main face 116 of the support 114. Wires 122 produce the electrical connections between the first electrical contact element 112 and the circuit 156, and between the circuit 156 and the second electrical contact element 120.

Such an "indirect" electrical connection between the two electrical contact elements 112, 120 can be produced for one or more of the first and second electrical contact elements 112, 120. Moreover, such an electrical connection by way of the circuit 156 can be produced in the aforementioned different embodiments.

Figure 11:
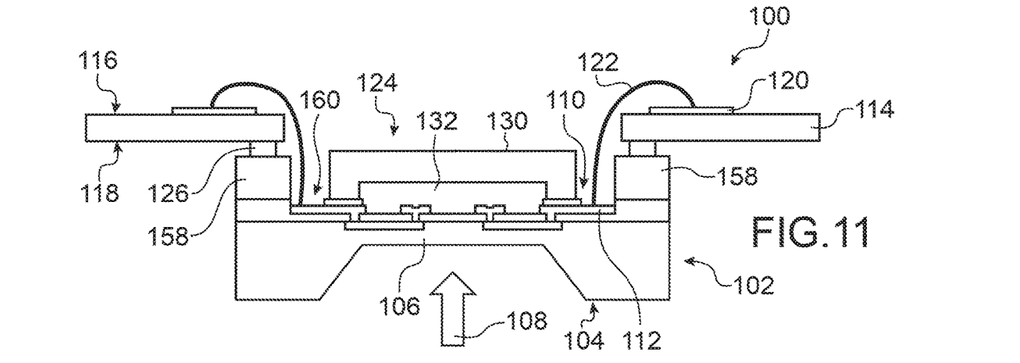

FIG. 11 shows a measuring device 100 according to a tenth embodiment.

In this embodiment, the support 114 is not directly attached onto the second main face 110 of the sensor 102. The cap 130 is, in this case, produced such that it comprises parts 158 onto which the second main face 118 of the support 114 is attached in a hermetically-sealed manner by the sealed seam 126, the cap 130 (and thus also the parts 158) being attached in a hermetically-sealed manner to the second main face 110 of the sensor 102. The second electrical contact elements 120 are electrically connected to the first electrical contact elements 112 by way of the electric wires 122 that pass through the cap 130 via openings 160 formed in the parts 158 of the cap 130.

Such a cap 130 is compatible with the aforementioned embodiments.

Figure 12:
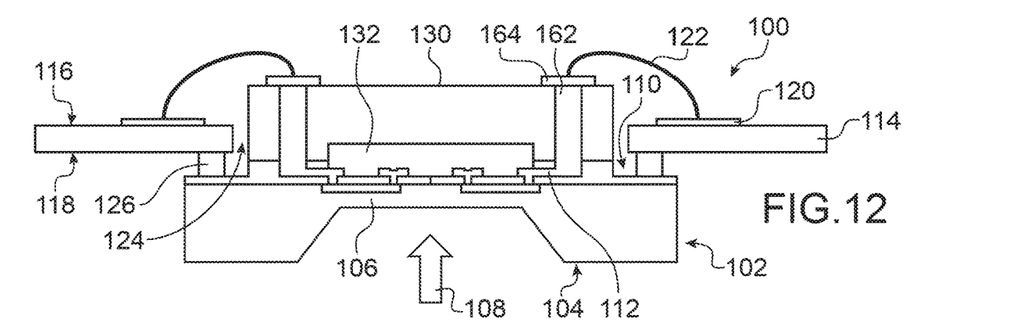

FIG. 12 shows a measuring device 100 according to an eleventh embodiment.

In this eleventh embodiment, the cap 130 has a large thickness and occupies a part of the opening 124 formed through the support 114. Moreover, the first electrical contact elements 112 are electrically connected to the second electrical contact elements 120 by the wires 122 as well as by conductive vias (or TSV for "Through Silicon Via") 162 that pass through the cap 130. Since the contact studs to which the wires 122 are connected are not directly formed by the first electrical contact elements 112, but instead by studs 164 present on the apex of the cap 130 and to which the conductive vias 162 are connected, such an embodiment allows the sensor 102 to be produced in smaller dimensions. This further eases the electrical connection between the first electrical contact elements 112 and the second electrical contact elements 120.

Such a cap 130 and the conductive vias 162 can be produced in the aforementioned different embodiments.

In the aforementioned embodiments, the measuring device 100 is produced such that the one or more first electrical contact elements 112 are arranged facing the opening 124 passing through the support 114, the electrical connections formed by the wires 122 or the conductive vias 162 between said first electrical contact elements 112 and the second electrical contact elements 120 pass through said opening 124. Moreover, in these aforementioned embodiments, the sensing part 106 of the sensor 102 is also arranged facing said opening 124.

Figure 13:
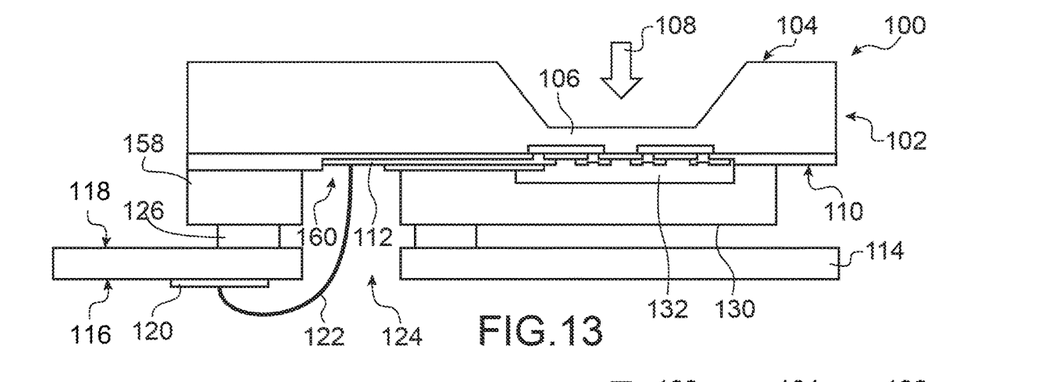

FIG. 13 shows the measuring device 100 according to a twelfth embodiment wherein the sensing part 106 of the sensor 102 is laterally offset relative to the opening 124. In this figure, only one of the first electrical contact elements 112 is arranged facing the opening 124. The wire 122 that connects said first electrical contact element 112 to the second electrical contact element 120 passes through the opening 124 and the cap 130 by way of an opening 160 formed in the cap 130. Moreover, in this twelfth embodiment, the support 114 is attached in a hermetically-sealed manner to a part 158 of the cap 130 at the periphery of the opening 124 by the sealed seam 126, whereby the cap 130 is itself attached in a hermetically-sealed manner to the sensor 102.

Figure 14:
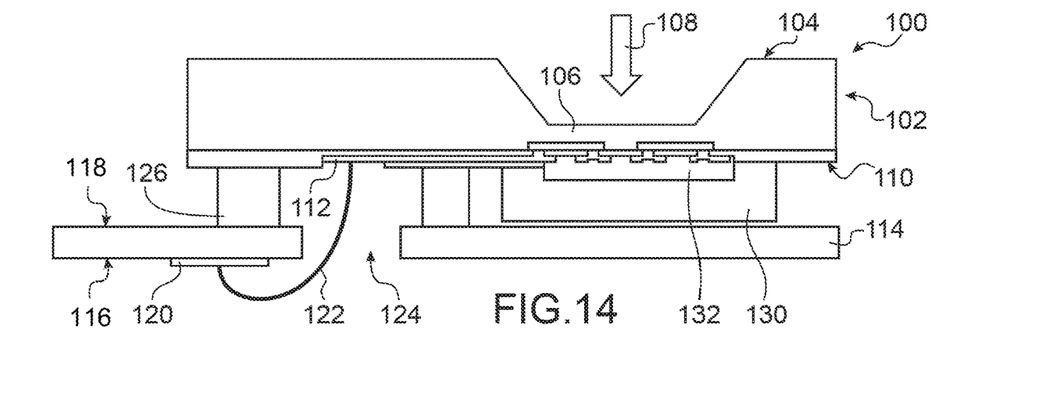

FIG. 14 shows the measuring device 100 according to a thirteenth embodiment. This measuring device 100 is substantially similar to that described above with reference to FIG. 13, with the exception that the support 114 is in this case attached directly to the second main face 110 of the sensor 102.

The embodiments shown in FIGS. 13 and 14 have the advantage of offsetting the sensing part 106 of the sensor 102 relative to the sealing area between the support 114 and the sensor 102, which produces improved mechanical and thermal decoupling of the sensing part 106 of the sensor 102 relative to the sealing area. This offsetting of the sensing part 106 of the sensor 102 relative to the sealing area can also be produced in the aforementioned embodiments.

Such a method for producing a measuring device 100, for example similar to that described above with reference to FIG. 8, is disclosed hereafter with reference to FIG. 15A to 15D.

Figure 15A:
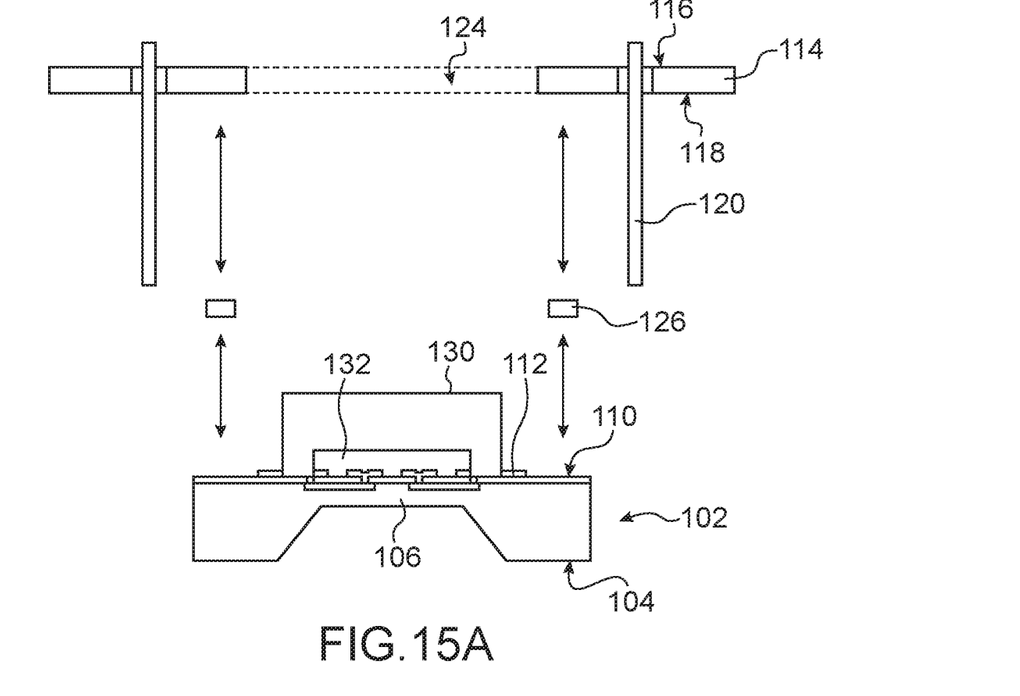
FIG. 15A to 15D show the steps of a method for producing a measuring device, as disclosed by this invention, according to one specific embodiment.

The sensor 102 is firstly produced using MEMS technology. The cap 130 is attached in a hermetically-sealed manner onto the first main face 110 of the sensor 102. The support 114 is also prepared by forming the opening 124 through the main faces 116 and 118 of the support 114. The second contact elements 120 are attached to the support 114 by being passed through the support 114 as shown in FIG. 15A.

Figure 15B:
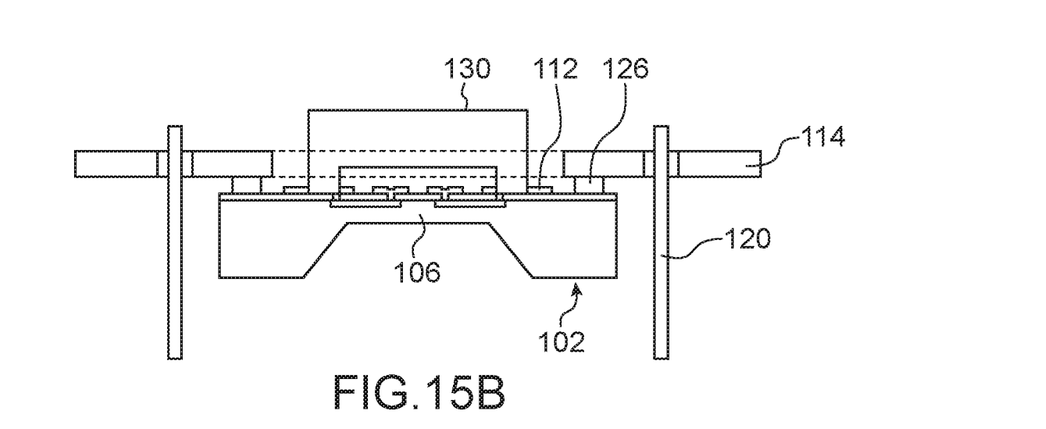

The sensor 102 is firstly aligned with the opening 124 of the support 114, then attached in a hermetically-sealed manner to the support 114 by soldering, with the sealed seam 126 (FIG. 15B).

Figure 15C:
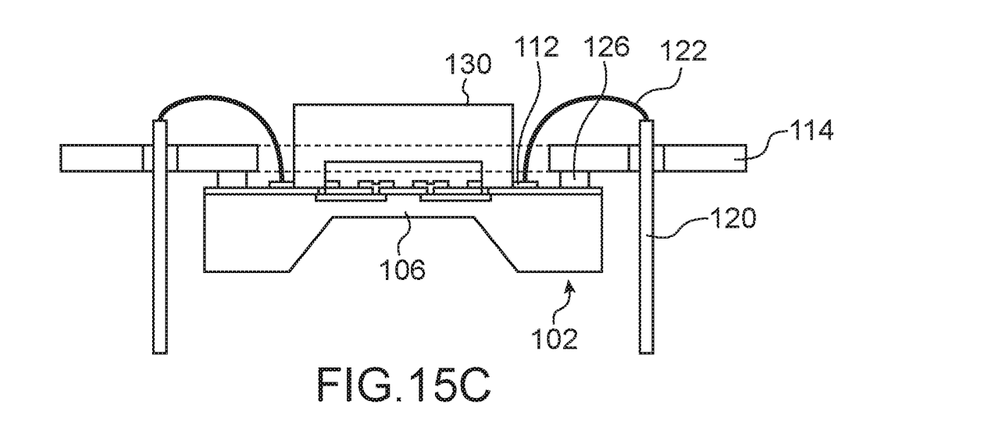

The electrical connections between the first electrical contact elements 112 and the second electrical contact elements 120 are then produced by connecting the wires 122 to said elements (FIG. 15C).

Figure 15D:
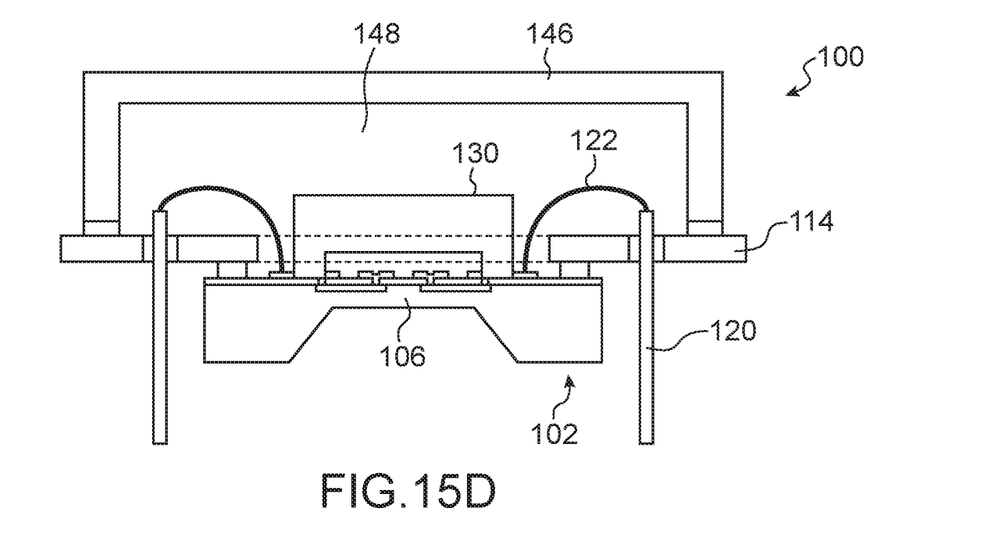

Finally, as shown in FIG. 15D, the measuring device 100 is completed by sealing the protective cover 146 onto the first main face 116 of the support 114. This sealing is, for example, produced by resistance welding, soldering, bonding, fusible glass or any other suitable sealing technique.

In all of the aforementioned embodiments, the measuring device 100 corresponds to a device for measuring the pressure of a fluid, whereby the sensor 102 corresponds to a pressure sensor. It is, however, possible for the sensor 102 to be capable of measuring one or more characteristics of the fluid other than the pressure thereof, or for it to correspond to another type of sensor, for example a microphone.

In the aforementioned different embodiments, the hermetically-sealed and/or watertight attachment between the sensor 102 and the support 114 is produced by the sealed seam 126. Alternatively, the attachment between the sensor 102 and the support 114 can be produced by implementing direct bonding, also referred to as molecular adhesion bonding, between the sensor 102 and the support 114. Depending on the nature of the materials intended to be attached to one another, this direct bonding can be implemented using or not using suitable portions of materials previously deposited on the sensor 102 and the support 114, for example portions of $SiO_2$.

Moreover, the electrical connections between the first and second electrical contact elements can be formed by connecting elements that are different to those described above, such as conductive balls or any other suitable means.

The invention claimed is:

1. A device for measuring at least one characteristic of a fluid, comprising:
    a sensor comprising a first main face provided with at least one sensing part that is sensitive to said characteristic and configured to be in contact with the fluid, and a second main face opposite the first main face and provided with at least one first electrical contact element on which at least one measurement signal from the sensor can be obtained;
    a support comprising a first main face provided with at least one second electrical contact element electrically connected to the first electrical contact element, a second main face opposite the first main face of the support, and at least one opening passing through the first and second main faces of the support; and
    a cap attached to the second main face of the sensor and delimiting, with the second main face of the sensor, at least one cavity that is hermetically closed and facing which is arranged at least the sensing part of the sensor, wherein the second main face of the sensor is attached in a watertight and/or hermetically-sealed manner to the second main face of the support at least at the periphery of the opening, and such that at least one part of the first electrical contact element is arranged facing and/or inside the opening, and wherein the sensing part of the sensor is laterally offset relative to the opening in the support and is not surrounded by a region of the sensor attached to the support.

2. The device according to claim 1, wherein the second main face of the support is intended to be in contact with the fluid.

3. The device according to claim 1, wherein the sensing part of the sensor comprises at least one membrane, whereby the sensor is a piezoresistive or capacitive or piezoelectric or heat sensor.

4. The device according to claim 1, wherein the second main face of the sensor is attached to the second main face of the support by at least one hermetic and/or watertight sealed seam or by direct bonding.

5. The device according to claim 1, wherein the second main face of the support is attached in a hermetically-sealed and/or watertight manner to the cap, which is hermetically attached to the second main face of the sensor.

6. The device according to claim 1, wherein the second electrical contact element is electrically connected to the first electrical contact element by at least one electrical connection passing through the cap.

7. The device according to claim 1, further comprising at least one protective material covering at least one part of the second main face of the sensor and at least one part of the second electrical contact element.

8. The device according to claim 1, further comprising a supporting element arranged between the second electrical contact element and the first main face of the support.

9. The device according to claim 1, wherein:
the support forms a part of at least one housing surrounding the sensor by forming at least one first volume in which the sensing part of the sensor is arranged and a second volume in which the first electrical contact element and one part of the second electrical contact element are arranged,
the support and the sensor form a hermetically-sealed and/or watertight separation between the first and second volumes,
the housing is provided with at least one orifice opening out into the first volume, and
the second electrical contact element passes through the housing and comprises an end arranged outside of the housing.

10. The device according to claim 1, further comprising at least one protective cover attached to the first main face of the support and forming, with the support and the sensor, at least one volume in which the first electrical contact element and a part of the second electrical contact element are located, whereby the second electrical contact element passes through the support and comprises an end arranged outside the volume.

11. The device according to claim 10, wherein the volume formed by the protective cover is closed in a hermetically-sealed and/or watertight manner, or the protective cover is penetrated by at least one orifice opening out into the volume.

12. The device according to claim 1, wherein the second electrical contact element is electrically connected to the first electrical contact element by way of an electrical and/or electronic element arranged on the first main face of the support.

13. A measuring assembly comprising at least one measuring device according to claim 1, and a duct in which the fluid can circulate, wherein the second main face of the support of the measuring device is attached in a hermetically-sealed and/or watertight manner to one end or to one wall of the duct such that the sensing part of the sensor is exposed to the interior of the duct by way of the end or by way of an opening formed in the wall of the duct.

14. A method for producing a device for measuring at least one characteristic of a fluid, comprising:
producing at least one sensor comprising a first main face provided with at least one sensing part that is sensitive to said characteristic and intended to be in contact with the fluid, and a second main face opposite the first main face and provided with at least one first electrical contact element on which at least one measurement signal from the sensor can be obtained;
producing at least one support comprising a first main face provided with at least one second electrical contact element, a second main face opposite the first main face of the support, and at least one opening passing through the first and second main faces of the support;
attaching a cap to the second main face of the sensor and delimiting, with the second main face of the sensor, at least one cavity that is hermetically closed and facing which is arranged at least the sensing part of the sensor;
attaching in a hermetically-sealed and/or watertight manner the second main face of the sensor to the second main face of the support at least at the periphery of the opening, such that at least one part of the first electrical contact element is arranged facing and/or inside the opening; and
producing an electrical connection electrically connecting the second electrical contact element to the first electrical contact element,
wherein the sensing part of the sensor is laterally offset relative to the opening in the support and is not surrounded by a region of the sensor attached to the support.

* * * * *